US006824817B2

(12) United States Patent
Araki et al.

(10) Patent No.: US 6,824,817 B2
(45) Date of Patent: Nov. 30, 2004

(54) METHOD OF MANUFACTURING MAGNETIC MULTILAYER FILM, METHOD OF MANUFACTURING MAGNETIC RECORDING MEDIUM, MAGNETIC MULTILAYER FILM AND MAGNETIC RECORDING MEDIUM

(75) Inventors: Satoru Araki, Tokyo (JP); Koki Takanashi, 1-7-402, Showamachi, Aoba-ku, Sendai-shi, Miyagi 981-0913 (JP); Toshiyuki Shima, Sendai (JP); Seiji Mitani, Sendai (JP); Takuto Moriguchi, Sendai (JP)

(73) Assignees: TDK Corporation, Tokyo (JP); Koki Takanashi, Sendai (JP)

( * ) Notice: Subject to any disclaimer, the term of this patent is extended or adjusted under 35 U.S.C. 154(b) by 0 days.

(21) Appl. No.: 10/245,591

(22) Filed: Sep. 18, 2002

(65) Prior Publication Data

US 2003/0175546 A1 Sep. 18, 2003

(30) Foreign Application Priority Data

Mar. 14, 2002 (JP) .................................... P2002-070632

(51) Int. Cl.[7] .................................................. B05D 5/12
(52) U.S. Cl. ........................ 427/131; 427/128; 427/130
(58) Field of Search ................................ 427/128, 130, 427/131; 428/694 TS, 694 T, 336, 900

(56) References Cited

U.S. PATENT DOCUMENTS 6,086,974 A * 7/2000 Thiele et al. ............. 428/65.3
6,605,321 B1 * 8/2003 Ravelosona-Ramasitera et al. .......................... 427/528

FOREIGN PATENT DOCUMENTS

JP A 8-186022 7/1996

OTHER PUBLICATIONS

Shima et al., "Synthesis ordered Fe/Pt alloys at low temperature by alternate monoatomic layer deposition", Outline of Lecture to the Japan Institute of Metals Annual Meeting, 2001 w/abstract.

Shima et al., "Low–temperature fabrication of $L1_0$ ordered FePt alloy by alternate monatomic layer deposition", Applied Physics Letters, vol. 80, No. 2, pp. 288–290, 2002.

* cited by examiner

*Primary Examiner*—Holly Rickman
(74) *Attorney, Agent, or Firm*—Oliff & Berridge, PLC

(57) ABSTRACT

On a substrate at a temperature of 120 to 240° C., Fe and Pt monatomic layers are alternately laminated. The magnetic multilayer film obtained by such a method has an $L1_0$ ordered structure so as to exhibit a high magnetic anisotropy energy constant, a (001) surface parallel to the substrate surface, and a high perpendicular magnetic anisotropy, while its coercive force in a direction perpendicular to the substrate surface and the squareness ratio of its magnetization curve in a direction perpendicular to the substrate surface are large, so that it is usable as a magnetic recording film for a magnetic recording medium and the like. Also, since the magnetic multilayer film is formed while the substrate temperature is 120 to 240° C., the temperature load on the substrate or the like is lowered as compared with conventional making methods in which the substrate temperature is about 500° C.

7 Claims, 3 Drawing Sheets

MAGNETIZATION (emu/cc)
(a) $T_{sub}$ =120 °C
$H_\perp$
$H_{//}$
1000
500
0
-500
-1000
-40
-20
0
20
40
MAGNETIC FIELD (kOe)

METHOD OF MANUFACTURING MAGNETIC MULTILAYER FILM, METHOD OF MANUFACTURING MAGNETIC RECORDING MEDIUM, MAGNETIC MULTILAYER FILM AND MAGNETIC RECORDING MEDIUM

BACKGROUND OF THE INVENTION

1. Field of the Invention

The present invention relates to a method of making a magnetic multilayer film of FePt having an $L1_0$ ordered structure, a method of making a magnetic recording medium, a magnetic multilayer film, and a magnetic recording medium.

2. Related Background Art

A magnetic multilayer film of FePt in which Fe and Pt monatomic layers are alternatively laminated has been known, for example, as disclosed in Japanese Patent Application Laid-Open No. HEI 8-186022. This magnetic multilayer film has an $L1_0$ ordered structure, thus yielding a high magnetic anisotropy energy constant, and is expected to be applied to high-density recording media, bias magnets of monolithic microwave integrated-circuits, and the like.

SUMMARY OF THE INVENTION

For improving performances of such a magnetic multilayer film and a magnetic recording medium utilizing the same, making methods which can restrain the magnetic multilayer film from being damaged have been in demand.

It is an object of the present invention to provide a method of making a magnetic multilayer film, a method of making a magnetic recording medium, a magnetic multilayer film, and a magnetic recording medium which can suppress damages.

The inventors conducted diligent studies and, as a result, have found a method of making a magnetic multilayer film which can suppress damages, by taking account of the substrate temperature at the time of laminating monatomic layers.

The present invention provides a method of making a magnetic multilayer film, comprising a monatomic layer laminating step of alternately laminating Fe and Pt monatomic layers on a substrate having a temperature of 120 to 240° C.

The magnetic multilayer film obtained by the method of making a magnetic multilayer film in accordance with the present invention has an $L1_0$ ordered structure so as to exhibit a high magnetic anisotropy energy constant, a (001) surface parallel to the substrate surface, and a high perpendicular magnetic anisotropy, while its coercive force in a direction perpendicular to the substrate surface and the squareness ratio of its magnetization curve in a direction perpendicular to the substrate surface are large, so that it is usable as a magnetic recording film for a magnetic recording medium and the like. Also, since the magnetic multilayer film is formed while the substrate temperature is 120 to 240° C., the temperature load on the substrate or the like is lowered as compared with conventional making methods in which the substrate temperature is about 500° C., whereby damages to the magnetic multilayer film are reduced.

Preferably, the monatomic layer laminating step is carried out at a pressure of $1\times10^{-6}$ Pa or less. Laminating monatomic layers under such an ultrahigh vacuum improves the purity of magnetic multilayer films and restrains the films from oxidizing and so forth.

Preferably, the method further comprises a buffer layer forming step of forming a buffer layer on the substrate prior to the monatomic layer laminating step.

Forming a buffer layer improves the wettability and flatness of the substrate, whereby the regularity of the $L1_0$ structure in the magnetic multilayer film becomes higher, which improves performances of the magnetic multilayer film.

Preferably, the buffer layer is formed from Pt, Au, or Ag and has a thickness of about 10 to 50 nm, whereby the buffer layer fully exhibits its functions.

Preferably, the method further comprises a seed layer forming step of forming a seed layer on the substrate prior to the buffer layer forming step.

When the seed layer is formed, the buffer layer laminated thereon can attain a (001) surface orientation, so that the orientation of the (001) surface of the magnetic multilayer film can be made parallel to the substrate surface more reliably, whereby a magnetic multilayer film having a high perpendicular magnetic anisotropy can be formed favorably.

Preferably, the seed layer is formed from Fe, Au, Ag, Ni, or Co and has a thickness of 0.2 to 2 nm, whereby the seed layer fully exhibits its functions.

The present invention provides a method of making a magnetic recording medium, including the above-mentioned method of making a magnetic multilayer film.

Since the method of making a magnetic recording medium in accordance with the present invention includes the above-mentioned method of making a magnetic multilayer film, a magnetic multilayer film having high magnetic performances can be obtained while its damages are reduced, whereby the magnetic recording medium attains a higher reliability.

The present invention provides a magnetic multilayer film comprising a substrate, seed and buffer layers successively laminated thereon, and Fe and Pt monatomic layers alternately laminated on the buffer layer.

In the magnetic multilayer film in accordance with the present invention, the seed layer makes the buffer layer reliably attain a (001) surface orientation, so that the (001) surface of the magnetic multilayer film laminated on the buffer layer can achieve an orientation parallel to the substrate surface more securely, whereby the perpendicular magnetic anisotropy becomes higher, while the coercive force in a direction perpendicular to the substrate surface and the squareness ratio of the magnetization curve in a direction perpendicular to the substrate surface become greater.

Preferably, the seed layer has a thickness of 0.2 to 2 nm and is formed from Fe, Au, Ag, Ni, or Co, whereas the buffer layer has a thickness of 10 to 50 nm and is formed from Pt, Au, or Ag. As a consequence, the seed and buffer layers fully exhibit their functions.

The present invention provides a magnetic recording medium comprising the above-mentioned magnetic multilayer film as a magnetic recording film. It yields a magnetic recording medium having a high perpendicular magnetic anisotropy, a large coercive force in a direction perpendicular to the substrate surface, and a great squareness ratio of the magnetization curve in a direction perpendicular to the substrate surface as mentioned above, since it has seed and buffer layers.

DESCRIPTION OF THE PREFERRED EMBODIMENTS

Figure 1:
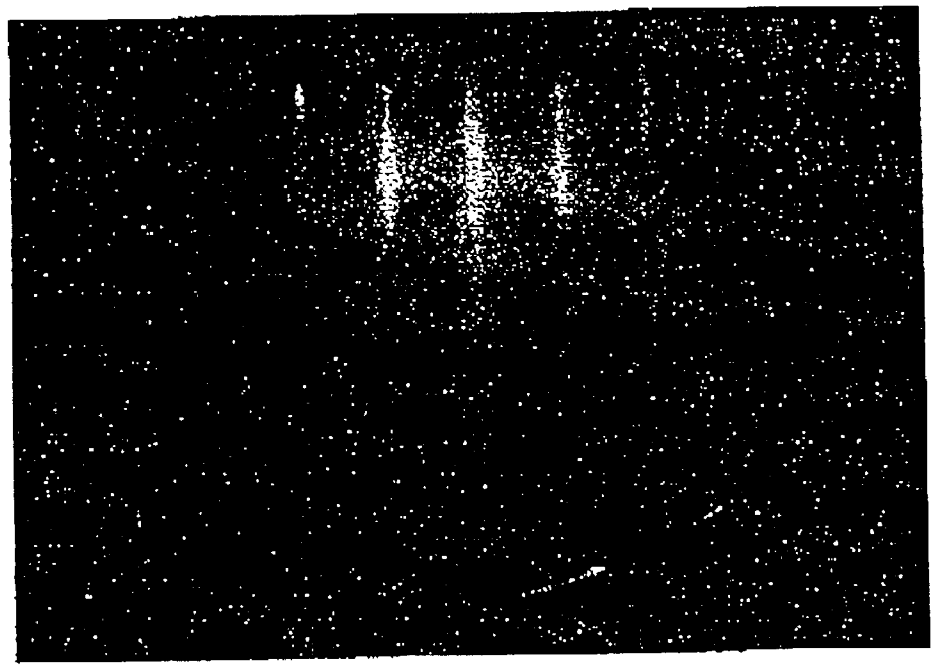
FIG. 1 is a RHEED pattern of a Pt layer as the uppermost layer in the magnetic multilayer film of Example 3.
Figure 2A:
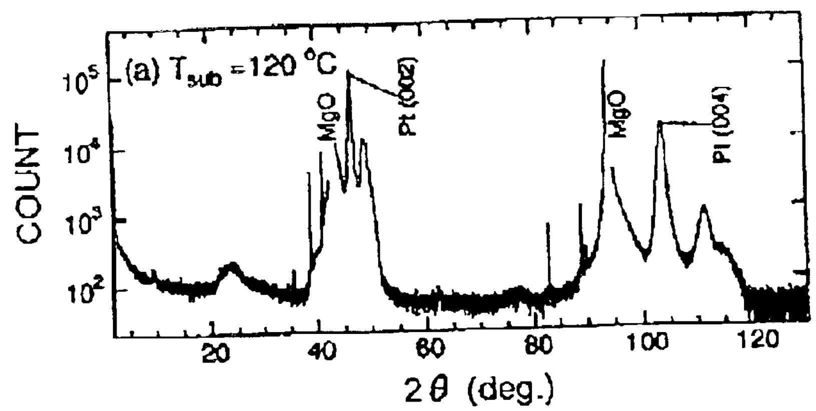
FIG. 2A is an X-ray diffraction pattern of the magnetic multilayer film obtained by Example 1.
Figure 2B:
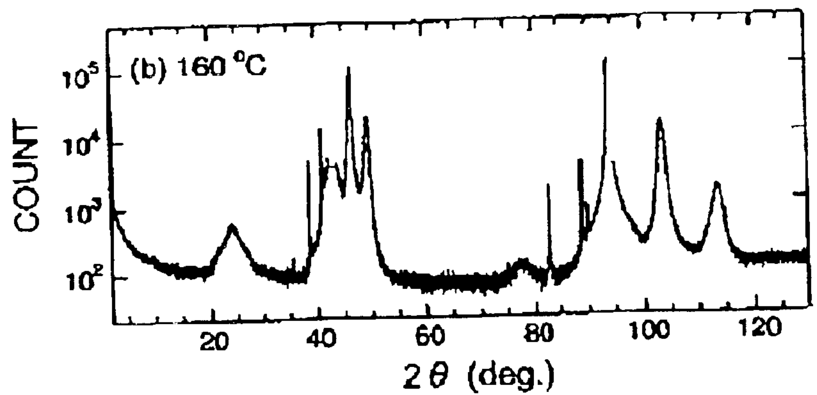
FIG. 2B is an X-ray diffraction pattern of the magnetic multilayer film obtained by Example 2.
Figure 2C:
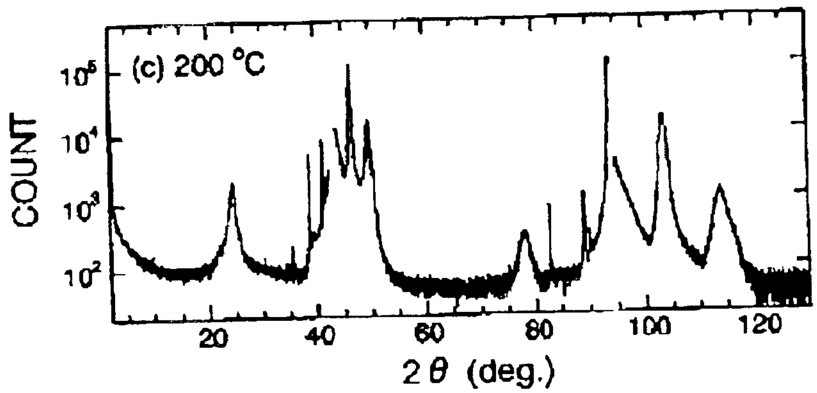
FIG. 2C is an X-ray diffraction pattern of the magnetic multilayer film obtained by Example 3.
Figure 2D:
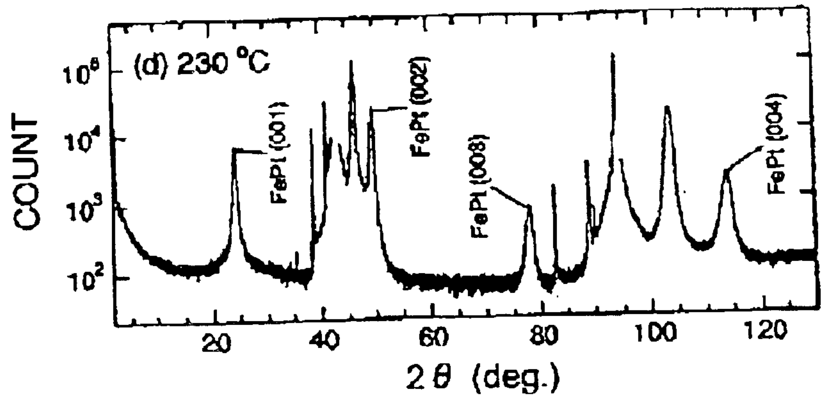
FIG. 2D is an X-ray diffraction pattern of the magnetic multilayer film obtained by Example 4.
Figure 3A:
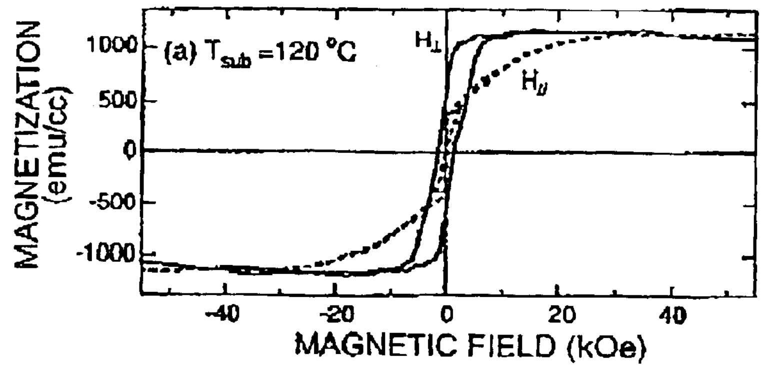
FIG. 3A is a chart showing respective magnetization curves in directions perpendicular (H') and parallel (H") to the substrate surface in the magnetic multilayer film obtained by Example 1.
Figure 3B:
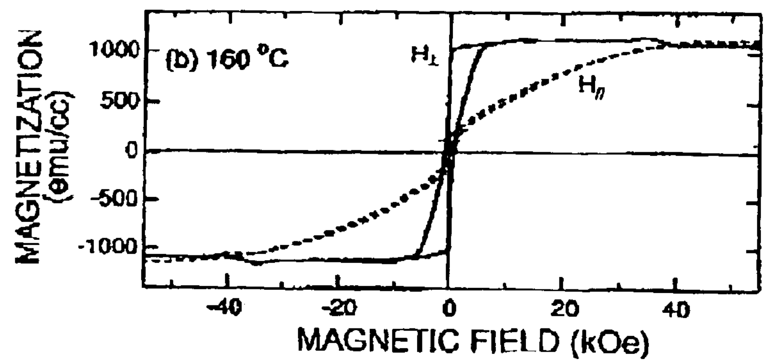
FIG. 3B is a chart showing respective magnetization curves in directions perpendicular (H') and parallel (H") to the substrate surface in the magnetic multilayer film obtained by Example 2.
Figure 3C:
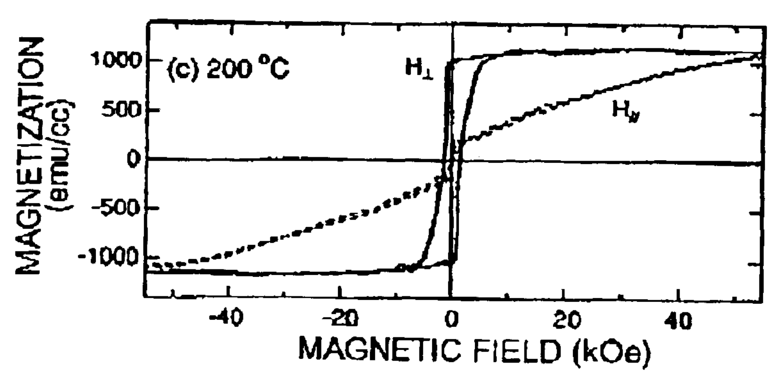
FIG. 3C is a chart showing respective magnetization curves in directions perpendicular (H') and parallel (H") to the substrate surface in the magnetic multilayer film obtained by Example 3.
Figure 3D:
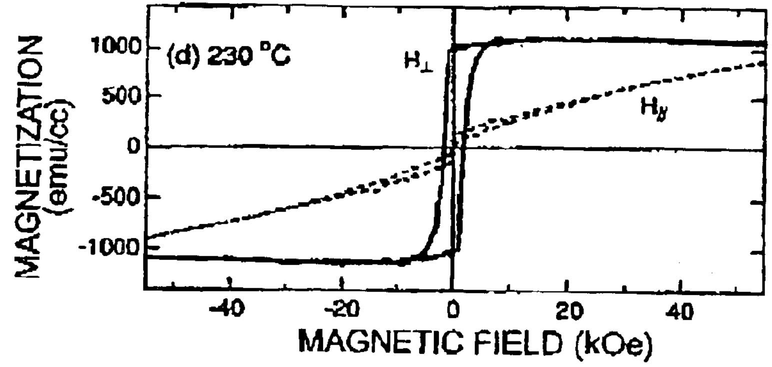
FIG. 3D is a chart showing respective magnetization curves in directions perpendicular (H') and parallel (H") to the substrate surface in the magnetic multilayer film obtained by Example 4.

In the following, preferred embodiments of the present invention will be explained in detail.

The method of making a magnetic multilayer film in accordance with this embodiment includes a seed layer forming step of forming a seed layer on a substrate, a buffer layer forming step of forming a buffer layer on the seed layer, and a monatomic layer laminating step of alternately laminating Fe and Pt monatomic layers on the buffer layer.

First, in the seed layer forming step, a seed layer having a predetermined thickness is formed on the substrate. This seed layer makes a buffer layer laminated thereon attain a (001) surface orientation.

Here, MgO(001), GaAs(001), Si(001), and the like, for example, are usable as the substrate, whereas Fe, Au, Ag, Ni, Co, and the like are usable as the seed layer. The thickness of the seed layer is preferably 0.2 to 2 nm, more preferably 0.5 to 1.5 nm. If the seed layer is too thin, the buffer layer laminated thereon will be harder to attain the (001) surface orientation. If the seed layer is too thick, it will be harder for the buffer layer to grow epitaxially thereon.

Subsequently, in the buffer layer forming step, a buffer layer is epitaxially grown on the seed layer. This buffer layer mainly improves the wettability and flatness of the substrate.

Here, as the buffer layer, one having a lattice spacing closer to that of FePt having an $L1_0$ structure can be used. For example, Pt, Au, Ag, and the like are usable. The thickness of the buffer layer is preferably 10 to 50 nm. If the buffer layer is too thin, flatness will be harder to secure. If the buffer layer is too thick, it will be harder for a monatomic layer of Fe or Pt to grow epitaxially thereon.

Preferably, in the seed layer forming step and buffer layer forming step, the temperature of the substrate ranges from an ambient temperature to about 240° C. If the temperature of the substrate is too high, seed atoms and buffer atoms will tend to grow like islands. More preferably, the films are formed while the substrate is held at an ambient temperature or the like so as not to yield islands, and then each film is heat-treated at about 200 to 240° C., so that the individual films are flattened by surface diffusion and the like.

Subsequently, as a monatomic layer laminating step, Fe and Pt monatomic layers are alternately laminated on thus obtained buffer layer, so as to form an [Fe(1 ML)/Pt(1 ML)] multilayer film. Here, ML refers to a monatomic layer.

In such a monatomic layer laminating step, the substrate temperature is preferably 120 to 240° C., more preferably 200 to 240° C. When formed at a substrate temperature of 120 to 240° C., the magnetic multilayer film attains sufficient magnetic performances, while the temperature load on the substrate or the like is lowered as compared with conventional making methods in which the substrate temperature is about 500° C., whereby damages to the magnetic multilayer film are reduced. When the substrate temperature is 200 to 240° C., a magnetic multilayer film having higher magnetic performances is obtained.

The number of laminate units when Fe(1 ML)/Pt(1 ML) is taken as one unit is preferably 10 to 300 though not restricted in particular.

The seed layer, buffer layer, and [Fe(1 ML)/Pt(1 ML)] multilayer film in such seed layer forming, buffer layer forming, and monatomic layer laminating steps are preferably formed under an ultrahigh vacuum (UHV) of $10^{-6}$ Pa or less, more preferably on the order of $1\times10^{-8}$ to $4\times10^{-7}$ Pa. Forming the films under an ultrahigh vacuum improves the purity of the magnetic multilayer film, and suppresses the oxidization of films and the like.

The method used for forming the seed layer, buffer layer, and [Fe(1 ML)/Pt(1 ML)] multilayer film are not restricted in particular, so that any of film forming methods such as sputtering can be employed. In particular, vacuum deposition which can easily form films under such an ultrahigh vacuum as that mentioned above is preferred.

Thus manufactured multilayer film has an $L1_0$ ordered structure so as to exhibit a high magnetic anisotropy constant, a (001) surface parallel to the substrate surface, and a high perpendicular magnetic anisotropy, while its coercive force in a direction perpendicular to the substrate surface and the squareness ratio of its magnetization curve in a direction perpendicular to the substrate surface are large, so that it is usable as a magnetic recording film for a magnetic recording medium and the like.

Also, the substrate temperature at the time of alternately laminating Fe and Pt monatomic layers and laminating seed and buffer layers is 240° C. or lower, so that the substrate is not heated to about 500° C. as in conventional cases, whereby the temperature load on the substrate or the like is lowered, while base layers such as the seed layer are restrained from diffusing and so forth, so as to reduce damages to the magnetic multilayer film.

Such a magnetic multilayer film with less damages and the like can favorably be utilized as a magnetic recording film of magnetic recording media such as magneto-optical recording media, hard disks, and thin-film magnets (patterned media), whereby magnetic recording media with a high reliability are obtained. In particular, thin-film magnets and the like become favorable in that the heat resistance of registry films for drawing patterns of a magnetic multilayer film by lithography becomes hardly problematic.

Examples of the method of making a magnetic multilayer film in accordance with this embodiment will now be explained.

Example 1

Using an ultrahigh vacuum deposition apparatus equipped with two independent electron guns respectively corresponding to Fe and Pt atoms and a substrate holder for holding a substrate, vapor deposition films of atoms were each formed with a desirable thickness in this Example. In this ultrahigh vacuum deposition apparatus, the temperature of the substrate could be measured with a high accuracy by a tungsten-rhenium thermocouple attached to the backside of the substrate holder. This thermocouple had been precisely calibrated beforehand according to measurement values obtained by another tungsten-rhenium thermocouple wrapped with a copper foil so as to be in direct contact with the substrate on the substrate holder.

The ultrahigh vacuum deposition apparatus further comprised a quartz oscillation type film thickness meter for accurately measuring the thickness of films laminated on the substrate. This film thickness meter had fully been calibrated beforehand with respect to each of Fe and Pt layers by observing vibration behaviors in RHEED (reflection high-energy electron diffraction) intensity and the like. In this Example, the thickness of each of the layers laminated was controlled by monitoring with the film thickness meter.

First, after the pressure within the container was vacuumed to about $1\times10^{-8}$ Pa, a seed layer of Fe having a thickness of 1 nm was formed on an MgO(001) substrate at a substrate temperature of 70° C. under an ultrahigh vacuum (UHV) of about $1\times10^{-7}$ Pa. After the lamination, the substrate was heated to about 200° C., so as to flatten the seed layer.

Subsequently, with the substrate temperature being set at 70° C., a buffer layer of Pt(001) was epitaxially grown by 40 nm on the seed layer. After the lamination, the substrate was heated to about 200° C., so as to flatten the buffer layer.

Then, as a monatomic layer laminating step, Fe and Pt monatomic layers were alternately laminated 50 times each on the buffer layer, so as to form an $[Fe(1\ ML)/Pt(1\ ML)]_{50}$ multilayer film, thereby yielding a magnetic multilayer film sample of Example 1. Here, the thickness of Fe monatomic layer was 0.14 nm, whereas the thickness of Pt monatomic layer was 0.2 nm. The lamination was carried out while the deposition rate of each atom was about 0.01 nm/s with the substrate temperature of 120° C.

atomic scale, whereas Pt and Fe were epitaxially grown layer by layer due to surface diffusion and the like.

When the composition of each of the magnetic multilayer films obtained by Examples 1 to 4 was determined by RBS (Rutherford Backscattering Spectrometry), the error in atomic ratio between Fe and Pt was within the range of ±3% in all of the magnetic multilayer film samples.

FIGS. 2A to 2D show results of X-ray diffraction analysis with CuKα radiation of the magnetic multilayer films obtained by Examples 1 to 4, respectively. In addition to fundamental reflection peaks of (002) and (004) surfaces, superlattice peaks of face-centered tetragonal lattices in (001) and (003) surfaces are clearly seen at all the substrate temperatures, whereby it can be verified that $L1_0$ ordered structures were formed. On the other hand, no peaks from other directions of $L1_0$ ordered structures are seen in particular, whereby it is found that the films having ordered structures in an atomic level were formed.

In the magnetic multilayer film laminated at 230° C. (Example 4), particularly sharp and strong superlattice peaks are seen. Since the superlattice peaks decrease as the substrate temperature lowers in the monatomic layer laminating step, it is seen that the degree of chemical ordering of magnetic multilayer films gradually decreases as the substrate temperature lowers.

Here, the individual peaks of FePt (00 L), where L=1, 2, 3, and 4, in FIGS. 2A to 2D are integrated with respect to the respective substrate temperatures, whereby the degree of chemical order S is defined as in the following expression:

$$S^2 = \frac{\lfloor I_{super}/I_{fund}\rfloor_{obs}}{\lfloor I_{super}/I_{fund}\rfloor_{calc}^{S=1}}$$

where $I_{fund}$ and $I_{super}$ indicate the fundamental and superlattice peak intensities, respectively. Calculated values of $I_{fund}$ and $I_{super}$ are estimated by atomic fraction, atomic scattering factor, Debye-Waller factor, Lorentz (polarization) factor, and structure factor.

Table 1 shows calculated values of degree of chemical order S in the respective magnetic multilayer films obtained at the individual substrate temperatures.

TABLE 1

| SUBSTRATE TEMPERATURE Ts (° C.) | FeATOMIC FRACTION $x_{Fe}$ (at. %) | PtATOMIC FRACTION $x_{Pt}$ (at. %) | DEGREE OF CHEMICAL ORDER S | UNIAXIAL MAGNETIC ANISOTROPY ENERGY CONSTANT $K_u$ (erg/cc) | SQUARENESS RATIO $Mr_\perp Ms_\perp$ | COERCIVE FORCE $Hc_\perp$(Oe) |
|---|---|---|---|---|---|---|
| 120 | 49.0 | 51.0 | 0.3 ± 0.1 | $1.4\times10^7$ | 0.51 | 1400 |
| 160 | 51.6 | 48.4 | 0.5 ± 0.1 | $2.3\times10^7$ | 0.87 | 800 |
| 200 | 52.4 | 47.6 | 0.3 ± 0.1 | $3.0\times10^7$ | 0.88 | 1500 |
| 230 | 49.3 | 50.7 | 0.3 ± 0.1 | $4.1\times10^7$ | 0.92 | 1700 |

Examples 2 to 4

Three magnetic multilayer film samples of Examples 2 to 4 were further obtained in the same manner as Example 1 except that the substrate temperature at the time of alternately laminating the Fe and Pt monatomic layers was 160° C., 200° C., and 230° C., respectively.

As an example of RHEED patterns of the Pt uppermost layer in thus prepared magnetic multilayer films, FIG. 1 shows the RHEED pattern of the magnetic multilayer film obtained by Example 3. Since a sharp striped pattern is seen, it is verified that a relatively flat surface was formed in an The value of the degree of chemical order S increased from 0.3 to 0.8 as the substrate temperature rose in the monatomic layer laminating step. It is seen that a high level of chemical ordering in magnetic multilayer film is obtained at a substrate temperature of about 200° C. or higher in particular.

FIGS. 3A to 3D show results of measurement of magnetization curves in directions perpendicular (H') and parallel (H") to the substrate surface in the respective magnetic multilayer films obtained by Examples 1 to 4, as yielded by a SQUID (Superconducting Quantum Interference Device)

magnetic meter while applying a magnetic field up to 5.5 T at ambient temperature.

As can be expected from the fact that the [001] direction of an $L1_0$ ordered structure was perpendicular to the substrate surface, all the magnetic multilayer films obtained at the individual substrate temperatures had their easy axis of magnetization perpendicular to the substrate surface, thereby exhibiting a perpendicular magnetic anisotropy.

In particular, the magnetic multilayer films obtained at a substrate temperature of 200° C. or higher could not attain saturated magnetization in a direction parallel to the substrate surface even in a magnetic field of 55 kOe, thus indicating the existence of a large uniaxial magnetic anisotropy.

For each of the magnetic multilayer films obtained, Table 1 further shows the uniaxial magnetic anisotropy constant Ku indicative of the intensity of magnetic anisotropy, the squareness ratio (Mr/Ms) of magnetization curve in the case where a magnetic field perpendicularly acts on the substrate surface, and the coercive force Hc in the direction perpendicular to the substrate surface.

In the magnetic multilayer films obtained by Examples 1 to 4, the uniaxial magnetic anisotropy constant Ku increased as the substrate temperature in the monatomic layer laminating step rose, and as the degree of chemical order S was higher. At any of the substrate temperatures, the uniaxial magnetic anisotropy constant Ku was at least $1\times10^7$ erg/cc, which was favorable as a magnetic recording medium, thus being a very large value on a par with that of FePt bulk alloy having an $L1_0$ ordered structure at $7\times10^7$ erg/cc.

The magnetic multilayer films obtained by Examples 1 to 4 yielded a squareness ratio (Mr/Ms) of 0.5 or greater, thus being practical as a magnetic recording film.

The magnetic multilayer films obtained by Examples 1 to 4 exhibited a coercive force Hc of 800 Oe or greater, thus being practical as a magnetic recording film. Though the coercive force Hc of the magnetic multilayer film decreased from 1700 Oe to 800 Oe as the substrate temperature lowered from 230° C. to 160° C., the coercive force Hc of the magnetic multilayer film obtained at the substrate temperature of 120° C. increased to 1400 Oe. Such a phenomenon seems to have occurred due to the fact that the degree of chemical order S at 120° C. was considerably lower than that at 160° C. so that the magnetic domain structure of the magnetic multilayer film changed.

In Examples 3 and 4, i.e., when the substrate temperature was 200° C. or higher, magnetic multilayer films having a very high uniaxial magnetic anisotropy energy constant Ku of $3.0\times10^7$ erg/cc or greater, a high coercive force Hc of 1500 Oe or greater, and a particularly favorable squareness ratio (Mr/Ms) of about 0.9 were obtained, which were quite favorable as a magnetic recording film.

What is claimed is:

1. A method of making a magnetic multilayer film, said method comprising a monatomic layer laminating step of alternately laminating Fe and Pt monatomic layers on a substrate having a temperature of 120 to 240° C.

2. A method of making a magnetic multilayer film according to claim 1, wherein said monatomic layer laminating step is carried out at a pressure of $1\times10^{31\ 6}$ Pa or less.

3. A method of making a magnetic multilayer film according to claim 1, further comprising a buffer layer forming step of forming a buffer layer on said substrate prior to said monatomic layer laminating step.

4. A method of making a magnetic multilayer film according to claim 3, wherein said buffer layer is formed from Pt, Au, or Ag and has a thickness of about 10 to 50 nm.

5. A method of making a magnetic multilayer film according to claim 3, further comprising a seed layer forming step of forming a seed layer on said substrate prior to said buffer layer forming step.

6. A method of making a magnetic multilayer film according to claim 5, wherein said seed layer is formed from Fe, Au, Ag, Ni, or Co and has a thickness of 0.2 to 2 nm.

7. A method of making a magnetic recording medium, said method including the method of making a magnetic multilayer film according to claim 1.

* * * * *